(12) United States Patent
Lesea

(10) Patent No.: US 6,946,870 B1
(45) Date of Patent: Sep. 20, 2005

(54) CONTROL OF SIMULTANEOUS SWITCH NOISE FROM MULTIPLE OUTPUTS

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 24 days.

(21) Appl. No.: 10/691,146

(22) Filed: Oct. 21, 2003

(51) Int. Cl.$^7$ .......................................... H03K 19/173
(52) U.S. Cl. ........................... 326/38; 326/41; 327/296; 327/297
(58) Field of Search .................. 326/21, 22, 38–41; 327/291, 299, 242, 258, 269; 713/500, 503

(56) References Cited

U.S. PATENT DOCUMENTS

| | | | | |
|---|---|---|---|---|
| 5,477,181 A | * | 12/1995 | Li et al. ....................... | 327/258 |
| 5,796,673 A | * | 8/1998 | Foss et al. ................... | 365/233 |
| 6,246,275 B1 | * | 6/2001 | Wodnicki et al. ........... | 327/291 |
| 6,294,925 B1 | | 9/2001 | Chan et al. | |
| 6,356,100 B1 | | 3/2002 | Wallace, Jr. et al. | |
| 6,426,649 B1 | * | 7/2002 | Fu et al. ....................... | 326/41 |
| 6,651,181 B1 | * | 11/2003 | Lacey ........................ | 713/503 |
| 6,714,057 B2 | * | 3/2004 | Nguyen ...................... | 327/115 |

* cited by examiner

Primary Examiner—Vibol Tan
(74) Attorney, Agent, or Firm—E. Eric Hoffman; John King

(57) ABSTRACT

Output switch noise resulting from simultaneous switching is reduced by time multiplexing the output switching operation. A plurality of phase-shifted clock signals are generated such that each of the phase-shifted clock signals exhibits an active (e.g., rising) edge during a single period of the reference clock signal. Different groups of input/output blocks are switched in response to the various phase-shifted clock signals, such that output switching occurs at various times during the period of the reference clock signal. The phase-shifted clock signals can be generated with predetermined phase differences or with dynamically determined phase differences.

23 Claims, 5 Drawing Sheets

CONTROL OF SIMULTANEOUS SWITCH NOISE FROM MULTIPLE OUTPUTS

FIELD OF THE INVENTION

The present invention relates to a method and apparatus for reducing the transient currents associated with simultaneously switched outputs of a semiconductor chip.

RELATED ART

Output signals of a semiconductor chip are typically switched simultaneously in response to an output clock signal. Such simultaneously switched outputs result in large transient currents, which cannot be easily controlled. Conventional methods used to control the large transient currents associated with simultaneously switched outputs include controlling the slew rate of the output signals and/or controlling the strength of the output signals. However, such methods either require excessive circuitry, or reduce the integrity of the output signals.

It would therefore be desirable to have an improved method and apparatus for reducing the high transient current associated with simultaneously switched outputs.

SUMMARY

Accordingly, the present invention reduces transient current created during output switching by time multiplexing the output switching operation within each clock period. A plurality of output clock signals are generated in response to an input clock signal, wherein the output clock signals are phase-shifted with respect to the input clock signal. Each of the phase-shifted clock signals exhibits an active (e.g., rising) edge during a single period of the input clock signal. Different groups of input/output blocks are switched in response to the various phase-shifted clock signals, such that output switching occurs at various times during the period of the input clock signal. The phase-shifted clock signals can be generated with predetermined phase differences or with dynamically determined phase differences.

In accordance with one embodiment, a digital clock manager generates a plurality of output clock signals, which are separated by 90-degree phase differences. For example, a first output signal may be synchronous with the input clock signal, a second output clock signal may lag the first output clock signal by 90 degrees, a third output clock signal may lag the second output clock signal by 90 degrees, and a fourth output clock signal may lag the third output clock signal by 90 degrees. A first set of input/output resources are clocked by the first output clock signal, a second set of input/output resources are clocked by the second output clock signal, a third set of input/output resources are clocked by the third output clock signal, and a fourth set of input/output resources are clocked by the fourth output clock signal. As a result, the transient switching current existing at any given time is reduced by a factor of four.

In accordance with another embodiment, a digital clock manager determines the period of the input clock signal. For example, delay elements may be introduced to the path of the input clock signal until the resulting output clock signal is synchronous with the input clock signal. At this time, the delay introduced by the delay elements is equal to one period of the input clock signal. The input clock signal (or resulting output clock signal) is applied to a chain of series-connected programmable delay lines, thereby generating a corresponding plurality of delayed clock signals. The delay introduced by each of the programmable delay lines is selected with respect to the period of the input clock signal. Thus, the sum of the delays introduced by the programmable delay lines is less than the period of the input clock signal.

In one embodiment, each of the programmable delay lines includes a plurality of delay elements, wherein each of the delay elements in the programmable delay lines is identical to each delay element in the digital clock manager. In this embodiment, the number of delay elements enabled within each of the programmable delay lines is determined by dividing the number of delay elements introduced by the digital clock manager by the number of programmable delay lines. As a result, each of the programmable delay lines introduces the same delay to the received clock signal.

The present invention will become more clearly understood in view of the following description and drawings.

DETAILED DESCRIPTION

Figure 1:
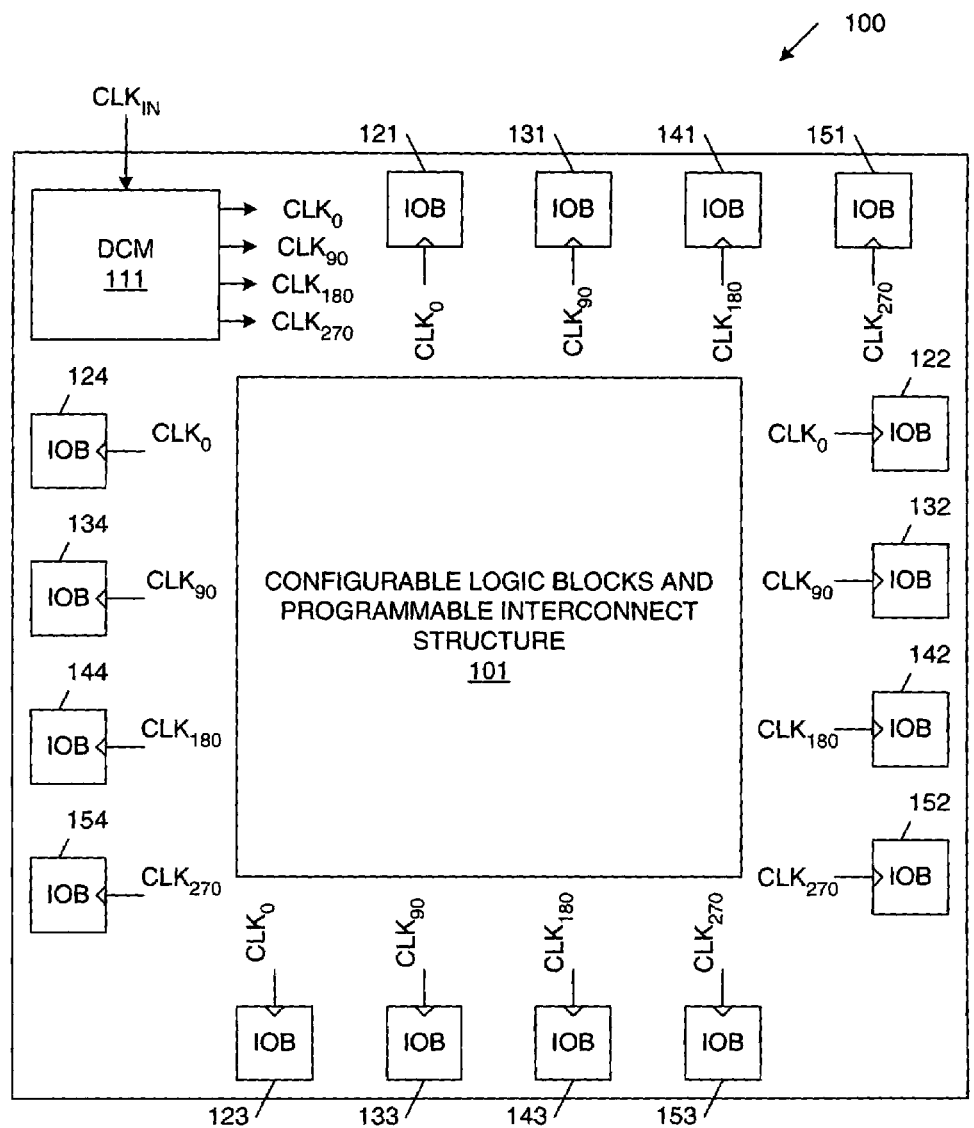
FIG. 1 is a block diagram of a field programmable gate array (FPGA) in accordance with one embodiment of the present invention.

FIG. 1 is a block diagram of a semiconductor chip 100 in accordance with one embodiment of the present invention. In the described embodiments, semiconductor chip 100 is a programmable logic device, such as a field programmable gate array (FPGA). However, semiconductor chip 100 need not be a programmable logic device. FPGA 100 includes an array of configurable logic blocks (CLBs) and a programmable interconnect structure, which are illustrated as block 101, a digital clock manager (DCM) 111, and configurable input/output blocks (IOBs) 121–124, 131–134, 141–144 and 151–154. In general, the elements of FPGA 100 are largely conventional, and are described in more detail in "Virtex™-II Platform FPGA Handbook", available from Xilinx, Inc. As described in more detail below, the configuration of FPGA 100 significantly reduces transient currents during output switching.

FPGA 100 operates as follows in accordance with one embodiment of the present invention. First, FPGA 100 is configured to implement a desired circuit by programming configuration memory cells of the FPGA. DCM 111 is configured to provide four output clock signals $CLK_0$, $CLK_{90}$, $CLK_{180}$ and $CLK_{270}$ in response to an input clock signal $CLK_{IN}$ during normal operation of FPGA 100. Although DCM 111 generates four clock phases in the present embodiment, it is understood that DCM 111 can be modified to provide other numbers of clock phases in other embodiments.

Figure 2:
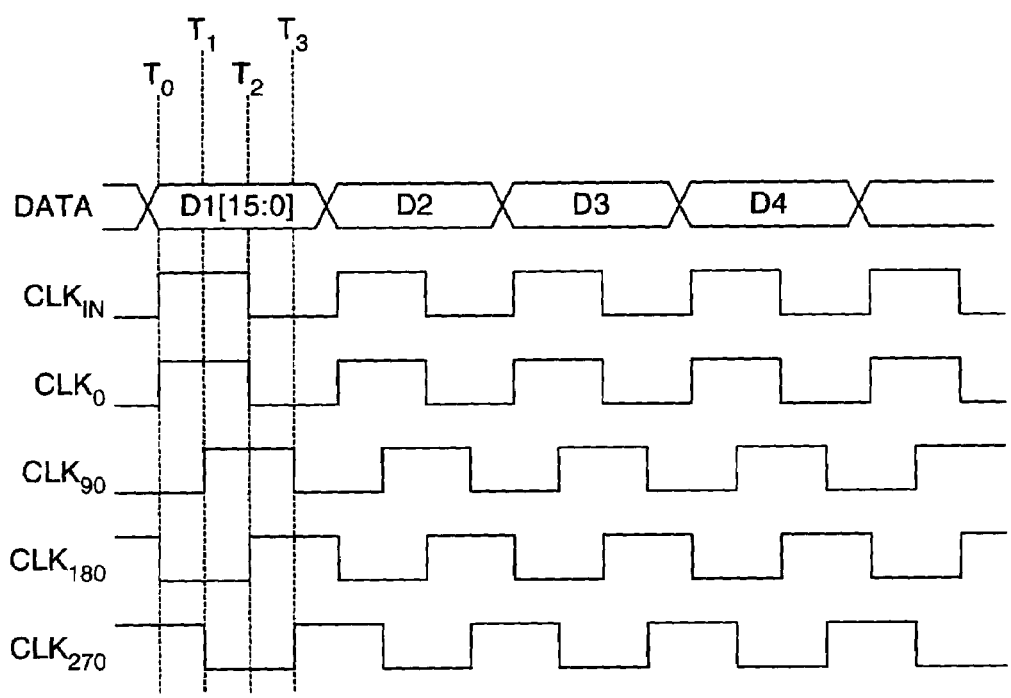
FIG. 2 is a waveform diagram illustrating an input clock signal $CLK_{IN}$, associated data values, and output clock signals $CLK_0$, $CLK_{90}$, $CLK_{180}$ and $CLK_{270}$, in accordance with one embodiment of the present invention illustrated by FIG. 1.

FIG. 2 is a waveform diagram illustrating the input clock signal $CLK_{IN}$, associated data values D1–D4, and the clock signals $CLK_0$, $CLK_{90}$, $CLK_{180}$ and $CLK_{270}$. As illustrated by FIG. 2, the clock signals $CLK_0$, $CLK_{90}$, $CLK_{180}$ and $CLK_{270}$ are separated in phase by ninety degrees. In the described embodiment, the input clock signal $CLK_{IN}$ and the clock signal $CLK_0$ are synchronized by DCM 111. Thus, both the $CLK_{IN}$ and $CLK_0$ signals exhibit rising edges at time $T_0$. One-quarter period later, at time $T_1$, the $CLK_{90}$ signal exhibits a rising edge, such that the $CLK_{90}$ signal lags the $CLK_0$ signal by 90 degrees. One-quarter period after time $T_1$ (at time $T_2$), the $CLK_{180}$ signal exhibits a rising edge, such that the $CLK_{180}$ signal lags the $CLK_{90}$ signal by 90 degrees. One-quarter period after time $T_2$ (at time $T_3$), the $CLK_{270}$ signal exhibits a rising edge, such that the $CLK_{270}$ signal lags the $CLK_{180}$ signal by 90 degrees. Note that data values D1[15:0] are clocked out of FPGA 100 during the clock period that includes times $T_0$–$T_3$.

In accordance with one embodiment, various IOBs of FPGA 100 are clocked with different clock signals. For example; IOBs 121–124 are clocked with the $CLK_0$ signal, IOBs 131–134 are clocked with the $CLK_{90}$ signal, IOBs 141–144 are clocked with the $CLK_{180}$ signal, and IOBs 151–154 are clocked with the $CLK_{270}$ signal. Thus, four bits of the D1[15:0] value (e.g., D1[3:0]) are clocked out through IOBs 121–124 at time $T_0$, four bits of the D1[15:0] value (e.g., D1[7:4]) are clocked out through IOBs 131–134 at time $T_1$, four bits of the D1[15:0] value (e.g., D1[11:8]) are clocked out through IOBs 141–144 at time $T_2$, and four bits of the D1[15:0] value (e.g., D1[15:2]) are clocked out through IOBs 151–154 at time $T_3$. Thus, only one fourth of the IOBs are clocked at any given time. This substantially reduces the transient current associated with output switching. Although the clock signals are applied to adjacent IOBs in an interleaved manner in the illustrated example, this is not required. For example, each of the IOBs located along a single edge of FPGA 100 (e.g., IOBs 121, 131, 141 and 151) can be coupled to receive the same clock signal.

Note that an external device attached to FPGA 100 must receive the input clock signal $CLK_{IN}$, and in response, generate clock signals equivalent to the $CLK_0$, $CLK_{90}$, $CLK_{180}$ and $CLK_{270}$ signals. The external device must have a first set of input circuits coupled to receive the equivalent $CLK_0$ signal, a second set of input circuits coupled to receive the equivalent $CLK_{90}$ signal, a third set of input circuits coupled to receive the equivalent $CLK_{180}$ signal, and a fourth set of input circuits coupled to receive the equivalent $CLK_{270}$ signal. The first, second, third and fourth sets of input circuits are coupled to receive the data signals clocked out of IOBs 121–124, 131–134, 141–144 and 151–154, respectively. The data values clocked out of IOBs 121–124, 131–134, 141–144 and 151–154 are then clocked into the first, second, third and fourth sets of input circuits of the external device in response to the equivalent $CLK_0$, $CLK_{90}$, $CLK_{180}$ and $CLK_{270}$ signals, respectively.

Figure 3:
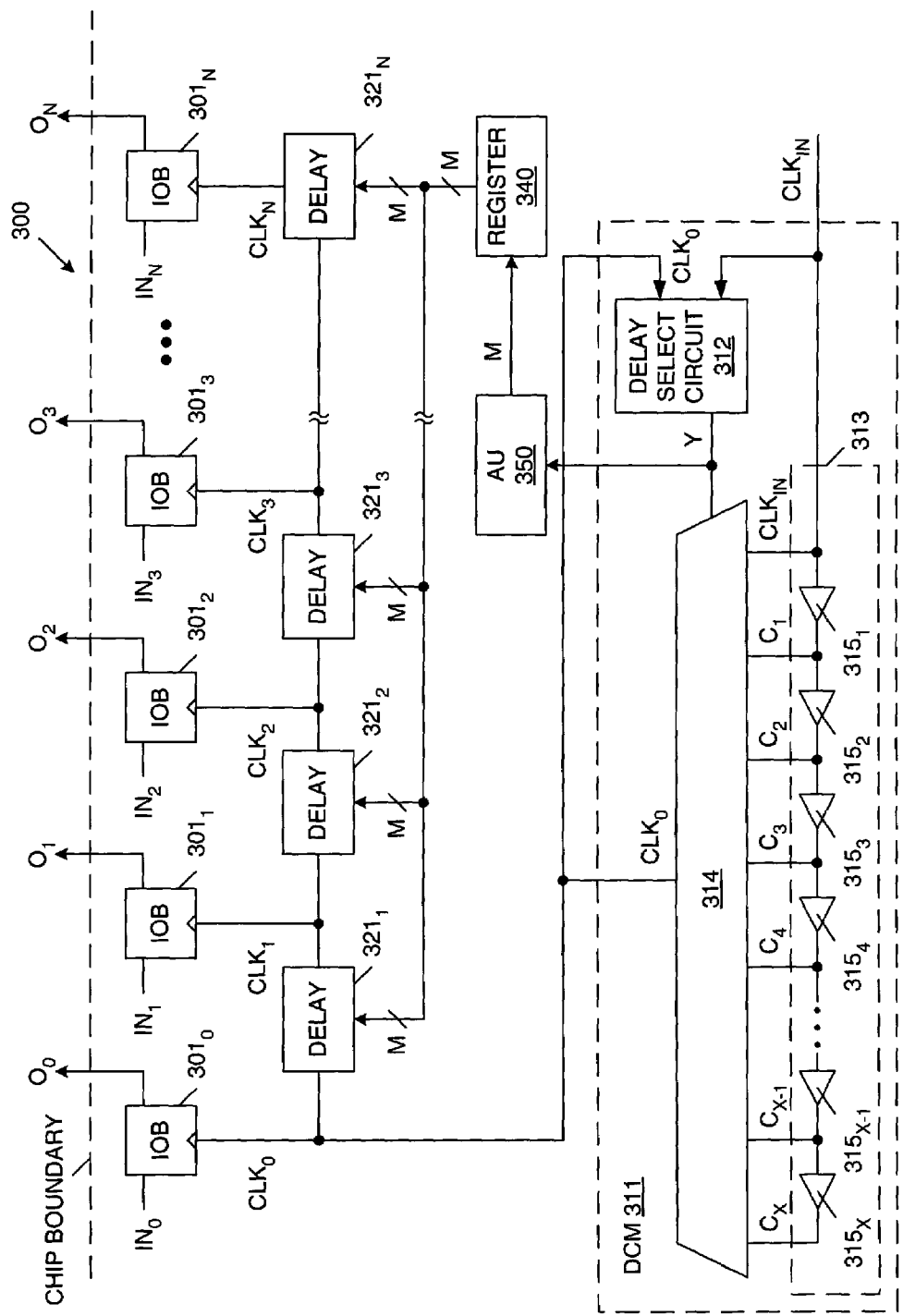
FIG. 3 is a circuit diagram illustrating a portion of an FPGA in accordance with another embodiment of the present invention.

FIG. 3 is a circuit diagram illustrating a portion of a semiconductor chip 300 in accordance with another embodiment. In the described embodiment, semiconductor chip 300 is described as a programmable logic device, such as an FPGA (although this is not necessary). FPGA 300 and FPGA 100 include similar programmable logic resources.

The illustrated portion of FPGA 300 includes IOBs $301_0$–$301_N$, DCM 311, programmable delay lines $321_1$–$321_N$, delay select register 340 and arithmetic unit (AU) 350. DCM 311 includes delay select circuit 312, delay line 313 and multiplexer 314. Delay line 313 includes a plurality (X) of delay elements $315_1$–$315_X$, which are con-nected in series as illustrated. The output terminals of delay elements $315_1$–$315_X$ are coupled to input terminals of multiplexer 314.

IOB $301_0$ is configured to receive the $CLK_0$ signal from DCM 311. IOB $301_0$ clocks the input signal $IN_1$ and output signal $O_0$ in response to the $CLK_0$ signal. As described in more detail below, the $CLK_0$ signal is synchronized with the input clock signal $CLK_{IN}$. In other embodiments, the $CLK_0$ can simply have a fixed phase relationship with respect to the $CLK_{IN}$ signal.

The $CLK_0$ signal is propagated through delay lines $321_1$–$321_N$, thereby creating delayed clock signals $CLK_1$–$CLK_N$, respectively. The delayed clock signals $CLK_1$–$CLK_N$ are provided to IOBs $301_1$–$301_N$, respectively. Thus, IOBs $301_1$–$301_N$, clock the respective input signals $IN_1$–$IN_N$ and output signals $O_1$–$O_N$, in response to delayed clock signals $CLK_1$–$CLK_N$, respectively.

In the described embodiment, each of delay lines $321_1$–$321_N$ is programmed to introduce the same delay (although this is not necessary in all embodiments). The delay introduced by each of delay lines $321_1$–$321_N$ is selected in response to a delay control signal M provided by register 340. That is, the number of delay elements introduced by each of delay lines $321_1$–$321_N$ is selected in response to delay control signal M.

Figure 4:
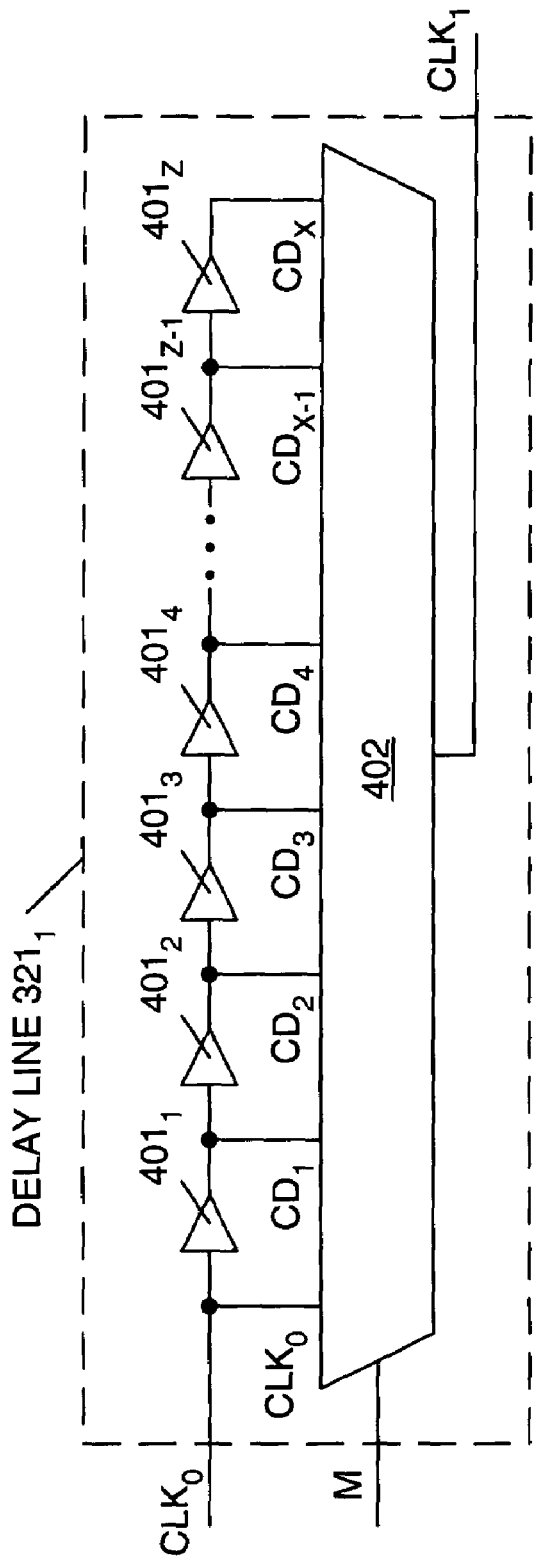
FIG. 4 is a circuit diagram of a programmable delay line in accordance with one embodiment of the present invention illustrated by FIG. 3.

FIG. 4 is a circuit diagram of delay line $321_1$ in accordance with one embodiment of the present invention. In this embodiment, delay line $321_1$ includes series-connected delay elements $401_1$–$401_Z$ and multiplexer 402. The $CLK_0$ signal propagates through delay elements $401_1$–$401_Z$, thereby creating delayed clock signals $CD_1$–$CD_Z$, respectively. The $CLK_0$ signal and the delayed clock signals $CD_1$–$CD_Z$ are provided to input terminals of multiplexer 402. Delay control signal M is provided to control terminals of multiplexer 402. Multiplexer 402 routes one of the clock signals $CLK_0$, $CD_1$–$CD_Z$ as the output clock signal $CLK_1$ in response to delay control signal M. For example, if the delay control signal M has a value of "3", then multiplexer 402 routes the clock signal $CD_3$ as the $CLK_1$ signal, thereby introducing three delay elements (and three delay periods) to the path of the $CLK_0$ signal. In this manner, delay control signal M controls the delay introduced by delay line $321_1$. Each of delay elements $401_1$–$401_Z$ can be implemented by a plurality of series connected inverters, or by other well known delay circuitry. In the described this embodiment, delay lines $321_2$–$321_N$ are identical to delay line $321_1$.

Returning now to FIG. 3, DCM 311 provides the $CLK_0$ signal in response to the input clock signal $CLK_{IN}$. More specifically, the $CLK_{IN}$ signal is applied to delay line 313. In response, delay elements $315_1$–$315_X$ provide delayed clock signals $C_1$–$C_X$, respectively. The $CLK_{IN}$ signal and the delayed clock signals $C_1$–$C_X$ are provided to input terminals of multiplexer 314. Delay select circuit 312, which is described in more detail below, provides delay select value Y to control terminals of multiplexer 314. Multiplexer 314 routes one of the clock signals $CLK_{IN}$, $C_1$–$C_X$ as the output clock signal $CLK_0$ in response to delay select value Y.

The signal routed by multiplexer 314 is provided as the $CLK_0$ signal. As described above, the $CLK_0$ signal is provided to IOB $301_0$ and delay line $321_1$. The $CLK_0$ signal is also provided to an input terminal of delay select circuit 312 within DCM 311. Delay select circuit 312 compares the $CLK_0$ and $CLK_{IN}$ signals, and adjusts the delay select value Y until the $CLK_0$ signal is synchronized with the $CLK_{IN}$ signal. That is, delay select circuit 312 adjusts the delay select value Y until the delay introduced to the $CLK_0$ signal is equal to one period of the $CLK_{IN}$ signal. The delay select value Y identifies the number of delay elements $315_1$–$315_X$ introduced to the path of the $CLK_0$ signal. Thus, when DCM 311 is locked, the delay select value Y identifies the number of delay elements $315_1$–$315_X$ corresponding with one period of the $CLK_{IN}$ signal.

The number of delay elements (Z) in each of programmable delay lines $321_1$–$321_N$ is selected to be equal to a subset of the number of delay elements (X) in delay line 313. In one embodiment, delay line 313 includes 128 delay elements (i.e., x=128), and each of programmable delay lines $321_1$–$321_N$ includes 8 delay elements (i.e., Z=8). In one embodiment, the number N of delay lines coupled in series is selected such that the total number of delay elements in the series-connected delay lines $321_1$–$321_N$ equals the total number of delay steps in delay line 313. Thus, in the described embodiment, N is equal to 16 (i.e., 128/8). Note that the variables Z, X and N can have other values in other embodiments.

Each of the delay elements in programmable delay lines $321_1$–$321_N$ is identical to the delay elements in delay line 313. For example, each of the delay elements $315_1$–$315_X$ in delay line 313 and each of the delay elements (e.g., $401_1$–$401_Z$) in each of delay lines $321_1$–$321_N$ may introduce a signal delay of 200 picoseconds.

The delay select value Y is also provided to arithmetic unit 350. In response, arithmetic logic unit 350 divides the number of delay elements represented by delay select value Y by the number (N) of programmable delay elements $321_1$–$321_N$, thereby creating a delay control value M that represents the number of delay elements to be inserted by each of the programmable delay lines $321_1$–$321_N$. For example, if delay select value Y indicates that 42 delay elements (i.e., delay elements $315_1$–$315_{42}$) are introduced to the path of the $CLK_{IN}$ signal (i.e., the period of the $CLK_{IN}$ signal is equal to 42 delay periods), then ALU 350 provides a delay control value M representative of the quotient of 42 and 16, or 2. Note that any fractional portion of the quotient is truncated. The delay control value M is stored in delay control register 340, and is provided to each of delay lines $321_1$–$321_N$. In the described example, each of programmable delay elements $321_1$–$321_N$ introduces two delay periods in response to the delay control value M.

Figure 5:
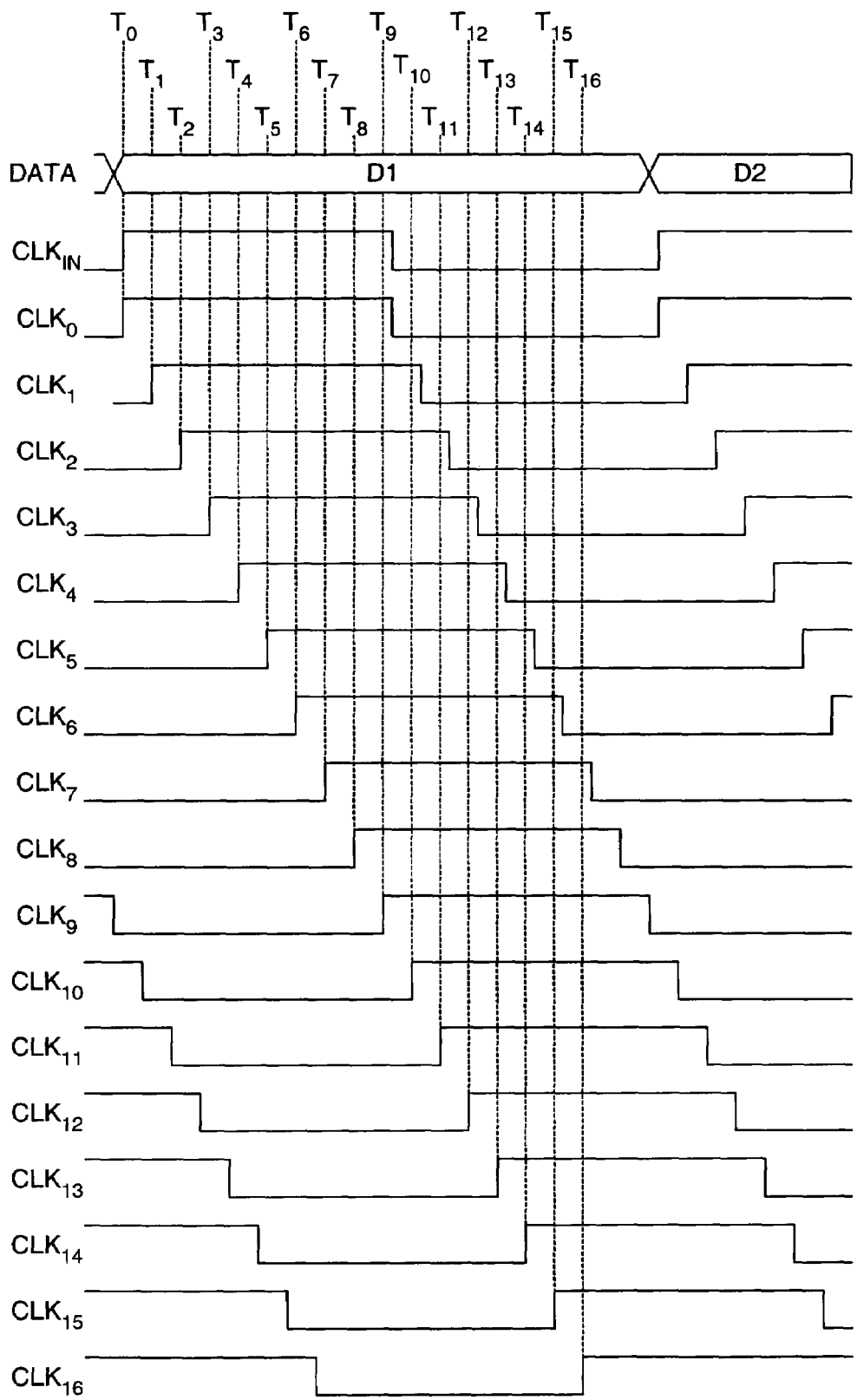
FIG. 5 is a waveform diagram illustrating an input clock signal $CLK_{IN}$, output clock signals $CLK_0$–$CLK_{16}$ and associated data values in accordance with one embodiment of the present invention illustrated by FIG. 3.

FIG. 5 is a waveform diagram illustrating the clock signals $CLK_{IN}$, $CLK_0$–$CLK_{16}$ and associated data values (e.g., D1[16:0]) in accordance with the described embodiment. As shown in FIG. 5, the $CLK_{IN}$ and $CLK_0$ signals exhibit rising edges at time $T_0$, and the $CLK_1$–$CLK_{16}$ signals exhibit rising edges at times $T_1$–$T_{16}$, respectively. Delays of about 400 picoseconds (the delay associated with two delay elements) exist between the rising edges of the successive clock signals $CLK_0$–$CLK_{16}$.

As a result, the bits associated with data value D1 are sequentially switched out of IOBs $301_0$–$301_{16}$ in a "zipper-like" manner during a single cycle of the $CLK_{IN}$ signal. Because these IOBs $301_0$–$301_{16}$ are not simultaneously switched, the transient output switching current is greatly reduced (e.g., by a factor of 17).

Although only one set of IOBs $301_0$–$301_N$ is illustrated in FIG. 3, it is understood that other identical sets of IOBs can be implemented in the same manner on the same FPGA.

When the temperature or other operating conditions of the FPGA change, the delay select value Y (i.e., the number of selected delay elements in delay line 313) may change dynamically. In this case, arithmetic logic unit 350 generates a new delay control value M (as appropriate) in response to the new delay select value Y. If a new delay control value M is generated (and stored in delay control register 340), then each of programmable delay lines $321_1$–$321_N$ is adjusted in view of this new delay control value M.

Although the invention has been described in connection with several embodiments, it is understood that this invention is not limited to the embodiments disclosed, but is capable of various modifications, which would be apparent to one of ordinary skill in the art. For example, the number of programmable delay line $321_1$–$321_N$ (FIG. 3) can be selected during configuration of the FPGA. That is, each IOB can have an associated programmable delay line that may be selectively coupled or de-coupled from adjacent programmable delay lines during the configuration of the FPGA. Thus, the present invention is only limited by the following claims.

I claim:

1. A semiconductor device comprising:
    a clock input terminal for receiving an input clock signal;
    a digital clock manager, comprising a plurality of series connected delay elements coupled to a multiplexer, for generating a plurality of clock signals in response to the input clock signal, wherein the plurality of clock signals are delayed versions of the input clock signal;
    a plurality of input/output blocks, including a first set of IOBs configured to operate in response to a first clock signal of the plurality of clock signals, a second set of IOBs configured to operate in response to a second clock signal of the plurality of clock signals, and a third set of IOBs configured to operate in response to a third clock signal of the plurality of clock signals.

2. The semiconductor device of claim 1, wherein the first clock signal is synchronous with the input clock signal, the second clock signal is delayed by a phase angle of 90 degrees with respect to the first clock signal, and the third clock signal is delayed by a phase angle of 180 degrees with respect to the first clock signal.

3. The semiconductor device of claim 1, wherein each of the plurality of clock signals is delayed by a predetermined phase with respect to the input clock signal.

4. The semiconductor device of claim 1, wherein the first, second and third sets of IOBs are interleaved along a perimeter of the semiconductor device.

5. The semiconductor device of claim 1, wherein the plurality of input/output blocks further includes a fourth set of IOBs configured to operate in response to a fourth clock signal of the plurality of clock signals.

6. The semiconductor device of claim 1, wherein each of the plurality of clock signals has the same frequency.

7. The semiconductor device of claim 1, wherein each of the plurality of clock signals exhibits a rising edge during a single period of the input clock signal.

8. A method of operating a semiconductor device comprising:
    receiving an input clock signal;
    generating a plurality of clock signals in response to the input clock signal;
    operating a first set of input/output blocks in response to a first clock signal of the plurality of clock signals, wherein the first clock signal lags the input clock signal by a predetermined first phase angle; and
    operating a second set of input/output blocks in response to a second clock signal of the plurality of clock signals, wherein the second clock signal lags the input clock signal by a predetermined second phase angle.

9. The method of claim 8, wherein the predetermined first phase angle is zero degrees and the second predetermined phase angle is 90 degrees.

10. The method of claim 8, wherein the predetermined first phase angle is 90 degrees and the second predetermined phase angle is 180 degrees.

11. The method of claim 8, wherein each of the plurality of clock signals has the same frequency.

12. The method of claim 8, wherein each of the plurality of clock signals exhibits a rising edge during a single period of the input clock signal.

13. A method of operating a semiconductor device comprising:
   determining a period of an input clock signal;
   introducing a plurality of discrete delays to the input clock signal, thereby generating a corresponding plurality of delayed clock signals, wherein the sum of the delays is less than the period of the input clock signal; and
   using the plurality of delayed clock signals to control output switching of the semiconductor device.

14. The method of claim 13, wherein the step of determining the period of the input clock signal comprises:
   applying the input clock signal to a delay line having a plurality of series-connected delay elements; and
   selecting an output clock signal from the delay line such that the output clock signal is synchronized with the input clock signal.

15. The method of claim 14, wherein a number of delay elements are introduced to the path of the input clock signal to create the output clock signal, wherein the number of delay elements introduce a signal delay corresponding with one period of the input clock signal and wherein the number is at least two.

16. The method of claim 15, further comprising determining each of the plurality of discrete delays in response to the number of delay elements.

17. The method of claim 16, wherein each of the plurality of discrete delays is determined by dividing the number of delay elements by the number of delayed clock signals.

18. A semiconductor device comprising:
   a digital clock manager configured to identify a period of an input clock signal;
   a plurality of series-connected programmable delay lines configured to provide a corresponding plurality of delayed clock signals in response to the input clock signal; and
   delay control circuitry coupled to the digital clock manager and the programmable delay lines, wherein the delay control circuitry is configured to program a delay in each of the plurality of series-connected programmable delay lines in response to the period of the input clock signal.

19. The semiconductor device of claim 18, wherein the digital clock manager comprises a delay select circuit configured to introduce delay elements to a path of the input clock signal to create a delayed clock signal, wherein the delay select circuit is configured to introduce delay elements such that the input clock signal is synchronized with the delayed clock signal.

20. The semiconductor device of claim 19, wherein the delay control circuitry comprises an arithmetic unit configured to divide a number of delay elements introduced by the digital clock manager by a number of programmable delay lines.

21. The semiconductor device of claim 18, wherein the digital clock manager comprises:
   a delay line configured to receive the input clock signal, wherein the delay line includes a plurality of series-connected delay elements;
   a selector circuit configured to receive delayed clock signals from the series-connected delay elements, and route one of the delayed clock signals as an output clock signal in response to a delay select value; and
   a delay select circuit configured to provide the delay select value to the selector circuit, wherein delay select circuit selects the delay select value such that the input clock signal is synchronous with the output clock signal.

22. The semiconductor device of claim 21, wherein each of the series-connected programmable delay lines includes one or more delay elements that are identical to the series-connected elements of the delay line.

23. A semiconductor device comprising:
   means for determining a period of an input clock signal;
   means for introducing a plurality of delays to the input clock signal, thereby generating a corresponding plurality of delayed clock signals, wherein the sum of the delays is less than the period of the input clock signal; and
   means for using the plurality of delayed clock signals to control output switching of the semiconductor device.

* * * * *